(12) United States Patent
Sano et al.

(10) Patent No.: US 11,322,308 B2
(45) Date of Patent: May 3, 2022

(54) CAPACITOR

(71) Applicant: KABUSHIKI KAISHA TOSHIBA, Minato-ku (JP)

(72) Inventors: Mitsuo Sano, Kamakura (JP); Susumu Obata, Yokohama (JP); Kazuhito Higuchi, Yokohama (JP); Kazuo Shimokawa, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 16/997,996

(22) Filed: Aug. 20, 2020

(65) Prior Publication Data

US 2021/0090814 A1    Mar. 25, 2021

(30) Foreign Application Priority Data

Sep. 20, 2019 (JP) .............................. JP2019-171151

(51) Int. Cl.
| | |
|---|---|
| *H01G 4/33* | (2006.01) |
| *H01G 4/01* | (2006.01) |
| *H01G 4/012* | (2006.01) |
| *H01G 4/30* | (2006.01) |
| *H01L 49/02* | (2006.01) |

(52) U.S. Cl.
CPC ................. *H01G 4/33* (2013.01); *H01G 4/01* (2013.01); *H01G 4/012* (2013.01); *H01G 4/306* (2013.01); *H01L 28/90* (2013.01)

(58) Field of Classification Search
CPC ........... H01G 4/33; H01G 4/01; H01G 4/012; H01G 4/306; H01L 28/90
See application file for complete search history.

(56) References Cited

U.S. PATENT DOCUMENTS

| | | | | |
|---|---|---|---|---|
| 2008/0237794 | A1* | 10/2008 | Shoji ........................ | H01G 4/33 257/532 |
| 2009/0244808 | A1* | 10/2009 | Ohtsuka .................... | H01G 4/06 361/311 |
| 2013/0161792 | A1 | 6/2013 | Tran et al. | |
| 2019/0019787 | A1* | 1/2019 | Park ......................... | H01G 4/40 |
| 2019/0181217 | A1* | 6/2019 | Kang ..................... | H01L 23/562 |

(Continued)

FOREIGN PATENT DOCUMENTS

| | | |
|---|---|---|
| JP | 06-325970 A | 11/1994 |
| JP | 2009-135310 A | 6/2009 |

(Continued)

*Primary Examiner* — Dion R. Ferguson
(74) *Attorney, Agent, or Firm* — Oblon, McClelland, Maier & Neustadt, L.L.P.

(57) ABSTRACT

According to an embodiment, a capacitor includes a conductive substrate, a conductive layer and a dielectric layer. The conductive substrate has a first main surface and a second main surface. The first main surface includes sub-regions. Each sub-region is provided with recesses or projections each having a shape extending in one direction and arranged in a width direction thereof. One or more of the sub-regions and another one or more of the sub-regions are different from each other in a length direction of the recesses or protrusions. The conductive layer covers sidewalls and bottom surfaces of the recesses or sidewalls and top surfaces of the projections. The dielectric layer is interposed between the conductive substrate and the conductive layer.

7 Claims, 12 Drawing Sheets

(56) References Cited

U.S. PATENT DOCUMENTS

| | | | |
|---|---|---|---|
| 2019/0348496 A1 | 11/2019 | Murase et al. | |
| 2020/0069159 A1* | 3/2020 | Uzawa | |
| 2020/0258682 A1* | 8/2020 | Matsuo | H01G 4/33 |
| 2021/0091171 A1* | 3/2021 | Higuchi | H01G 4/30 |

FOREIGN PATENT DOCUMENTS

| | | |
|---|---|---|
| JP | 2009-246180 A | 10/2009 |
| JP | 2010-171043 A | 8/2010 |
| KR | 10-2019-0007630 A | 1/2019 |
| WO | WO 2017/217342 A1 | 12/2017 |
| WO | WO 2018/174191 A1 | 9/2018 |
| WO | WO 2019/171470 A1 | 9/2019 |

* cited by examiner

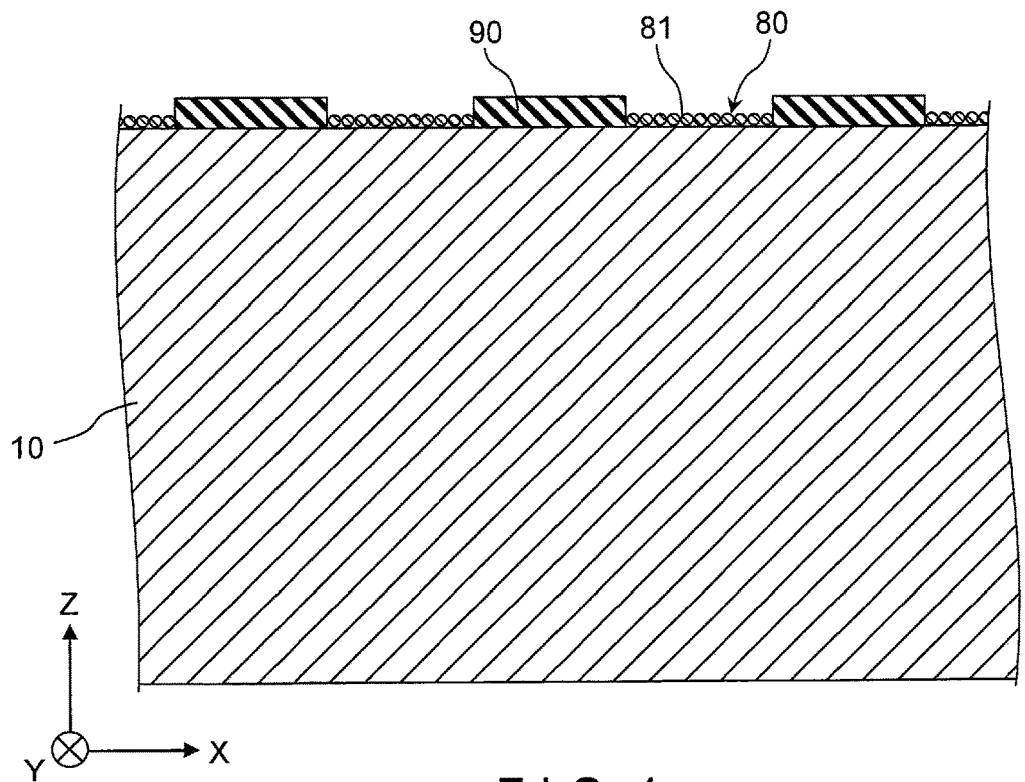
F I G. 4
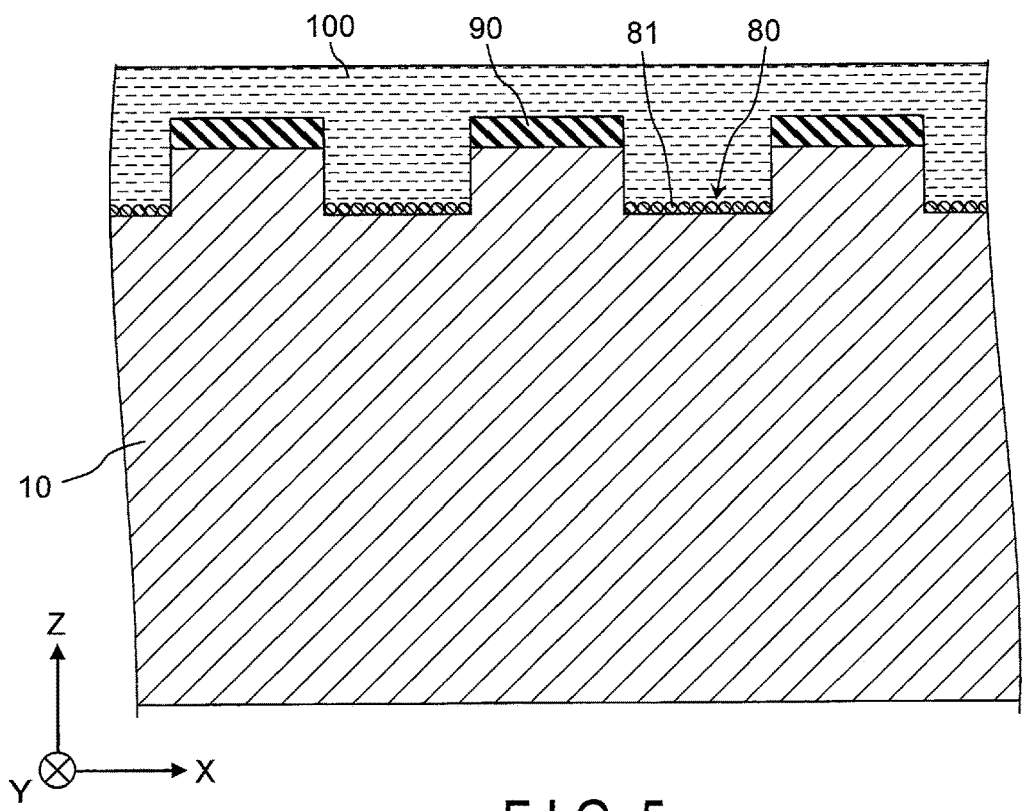
F I G. 5

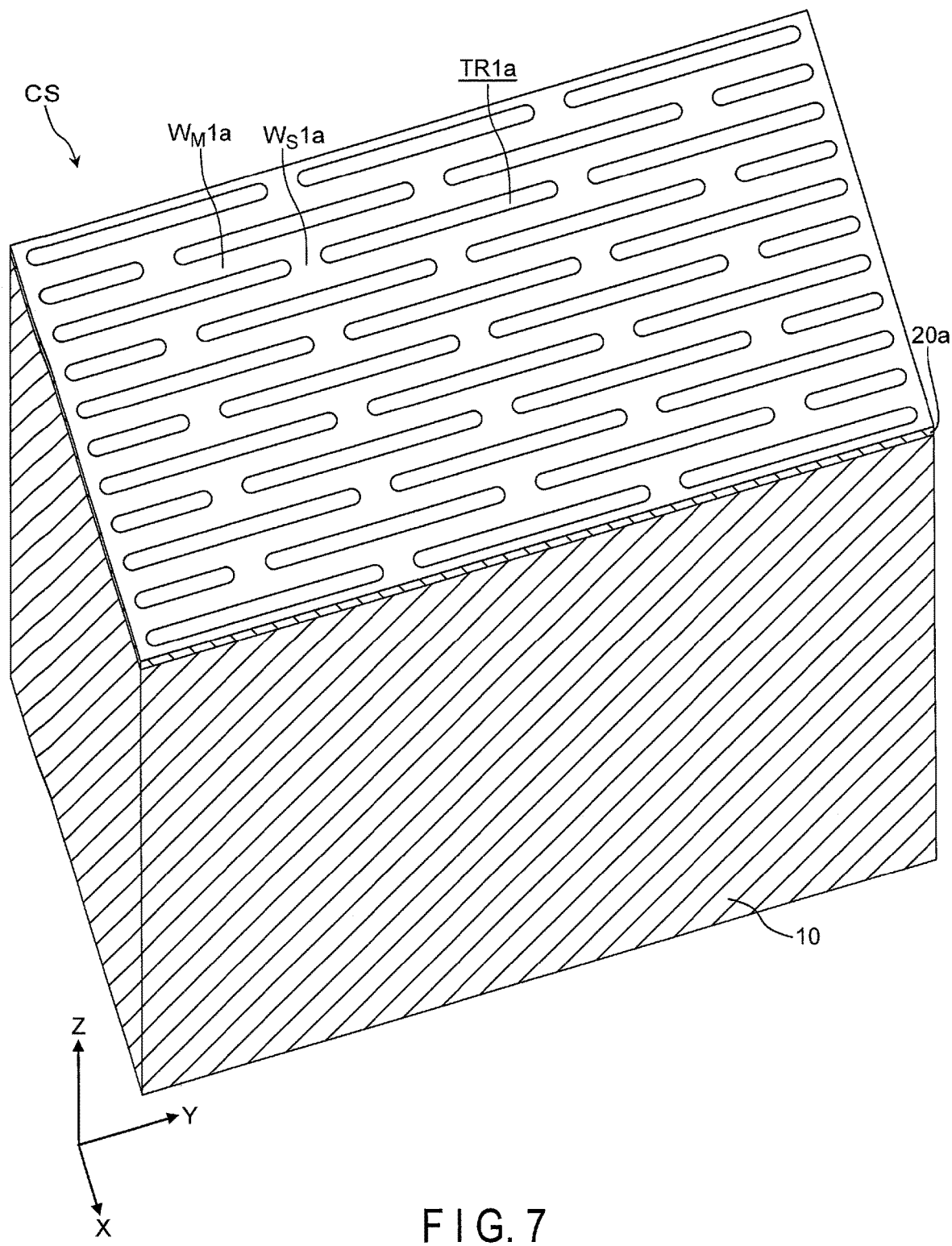
F I G. 7

CAPACITOR

CROSS-REFERENCE TO RELATED APPLICATION

This application is based upon and claims the benefit of priority from Japanese Patent Application No. 2019-171151, filed Sep. 20, 2019, the entire contents of which are incorporated herein by reference.

FIELD

Embodiments described herein relate generally to a capacitor.

BACKGROUND

With the downsizing and upgrading of communication equipment, capacitors to be mounted thereon are desired to be smaller and thinner. As a structure to achieve downsizing and reducing the thickness of the capacitor while maintaining the capacitance density, there is a trench capacitor in which trenches are formed on a substrate to increase the surface area.

BRIEF DESCRIPTION OF THE DRAWINGS

FIG. 4 is a cross-sectional view showing a process in the manufacture of the capacitor shown in FIGS. 1 and 2;

FIG. 5 is a cross-sectional view showing another process in the manufacture of the capacitor shown in FIGS. 1 and 2;

FIG. 7 is a perspective view of a conductive substrate included in a capacitor according to a first modification;

DETAILED DESCRIPTION

Figure 1:
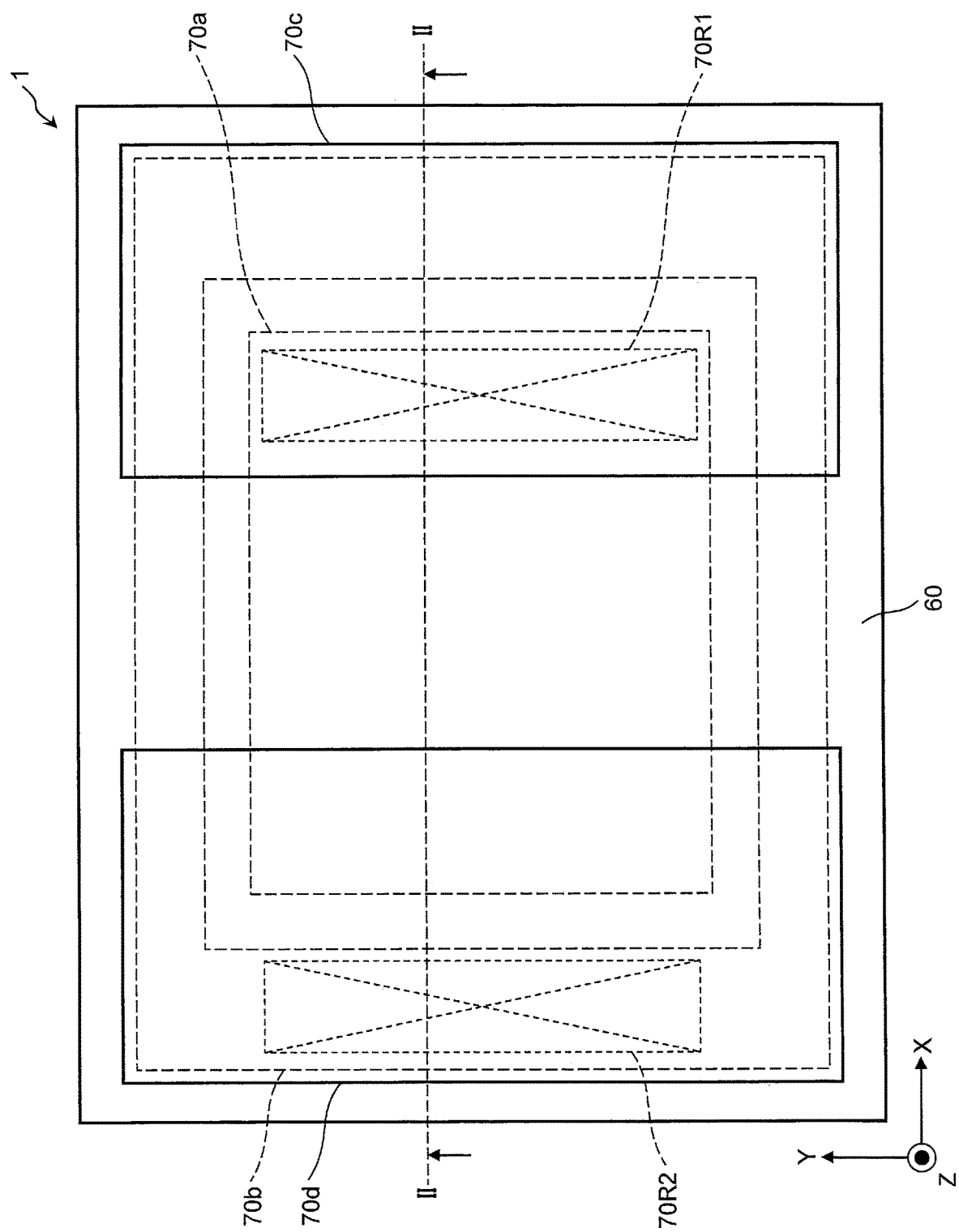
FIG. 1 is a top view of a capacitor according to a first embodiment.

A capacitor according to a first aspect comprises a conductive substrate having a first main surface and a second main surface, the first main surface including a plurality of first sub-regions, each of the first sub-regions being provided with a plurality of first recesses or first projections each having a shape extending in one direction and arranged in a width direction thereof, and one or more of the first sub-regions and another one or more of the first sub-regions being different from each other in a length direction of the first recesses or first protrusions; a conductive layer covering sidewalls and bottom surfaces of the first recesses or sidewalls and top surfaces of the first projections; and a dielectric layer interposed between the conductive substrate and the conductive layer.

Embodiments will be described in detail below with reference to the accompanying drawings. Note that the same reference numerals denote constituent elements which achieve the same or similar functions throughout all the drawings, and repetitive explanations will be omitted.

First Embodiment

Figure 2:
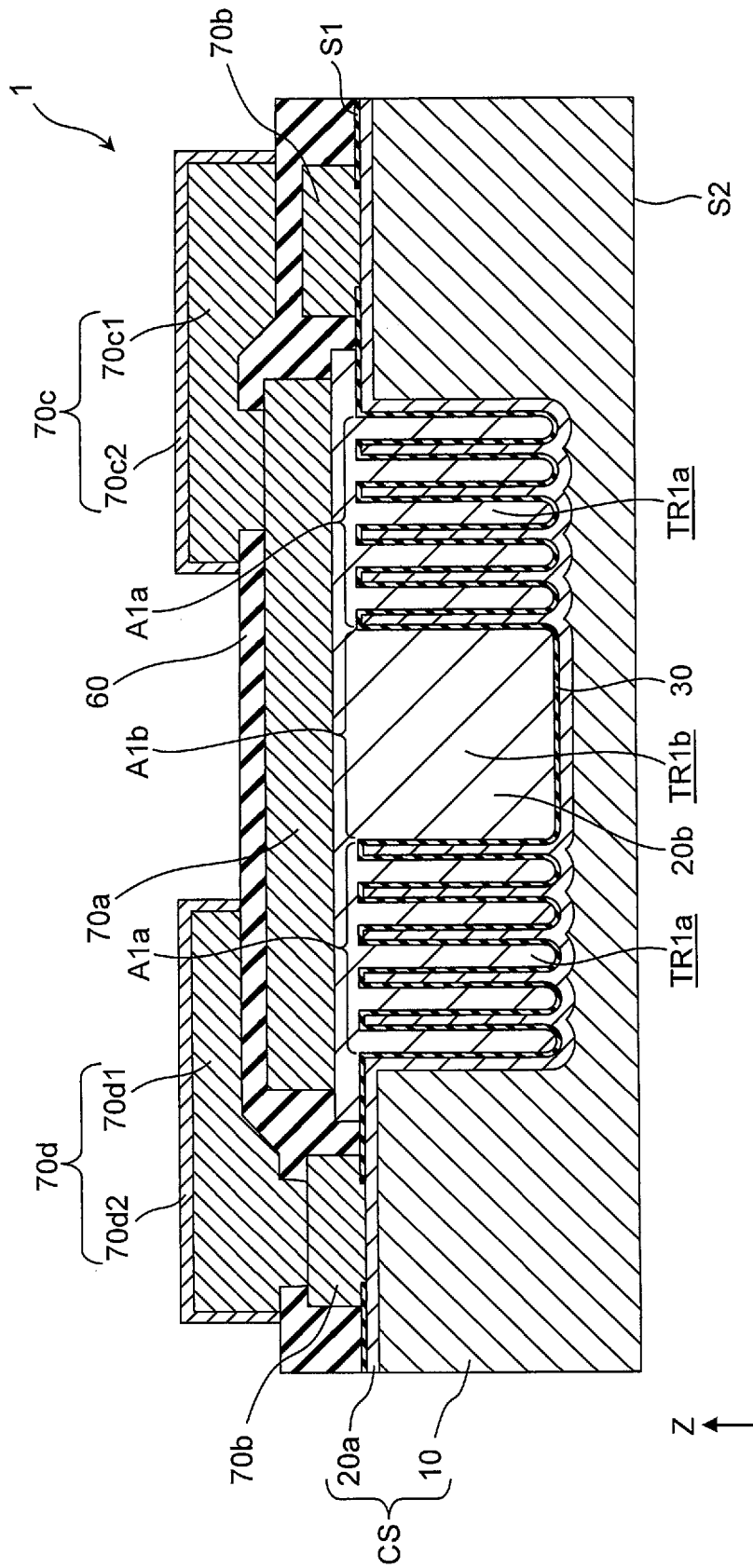
FIG. 2 is a cross-sectional view taken along a line II-II of the capacitor shown in FIG. 1.

FIGS. 1 and 2 show a capacitor according to a first embodiment.

A capacitor 1 shown in FIGS. 1 and 2 includes a conductive substrate CS, a conductive layer 20b, and a dielectric layer 30, as shown in FIG. 2.

In each figure, an X direction is a direction parallel to a main surface of the conductive substrate CS, and a Y direction is a direction parallel to the main surface of the conductive substrate CS and perpendicular to the X direction. In addition, a Z direction is a thickness direction of the conductive substrate CS, i.e., a direction perpendicular to the X direction and the Y direction.

The conductive substrate CS is a substrate having electrical conductivity at least in its surface facing the conductive layer 20b. The conductive substrate CS serves as a lower electrode of the capacitor.

The conductive substrate CS has a first main surface S1, a second main surface S2, and an end face extending from an edge of the first main surface S1 to an edge of the second main surface S2. Here, the conductive substrate CS has a flat and approximately right-angled parallelepiped shape. The conductive substrate CS may have other shapes.

The first main surface S1, i.e., a top surface of the conductive substrate CS in this embodiment, includes a plurality of first sub-regions. A dimension of each of the first sub-regions in their arrangement direction is preferably within a range of 5 μm to 1,000 μm, and more preferably within a range of 10 μm to 100 μm. Alternatively, a ratio of the dimension of each of the first sub-regions in their arrangement direction to a dimension of the conductive substrate CS in this arrangement direction is preferably within a range of 1/500 to 1/2, and more preferably within a range of 1/200 to 1/20.

Each of the first sub-regions is provided with a plurality of first recesses each having a shape extending in one direction and arranged in the width direction. One or more first sub-regions and another one or more first sub-regions are different in the length direction of the first recesses.

Figure 3:
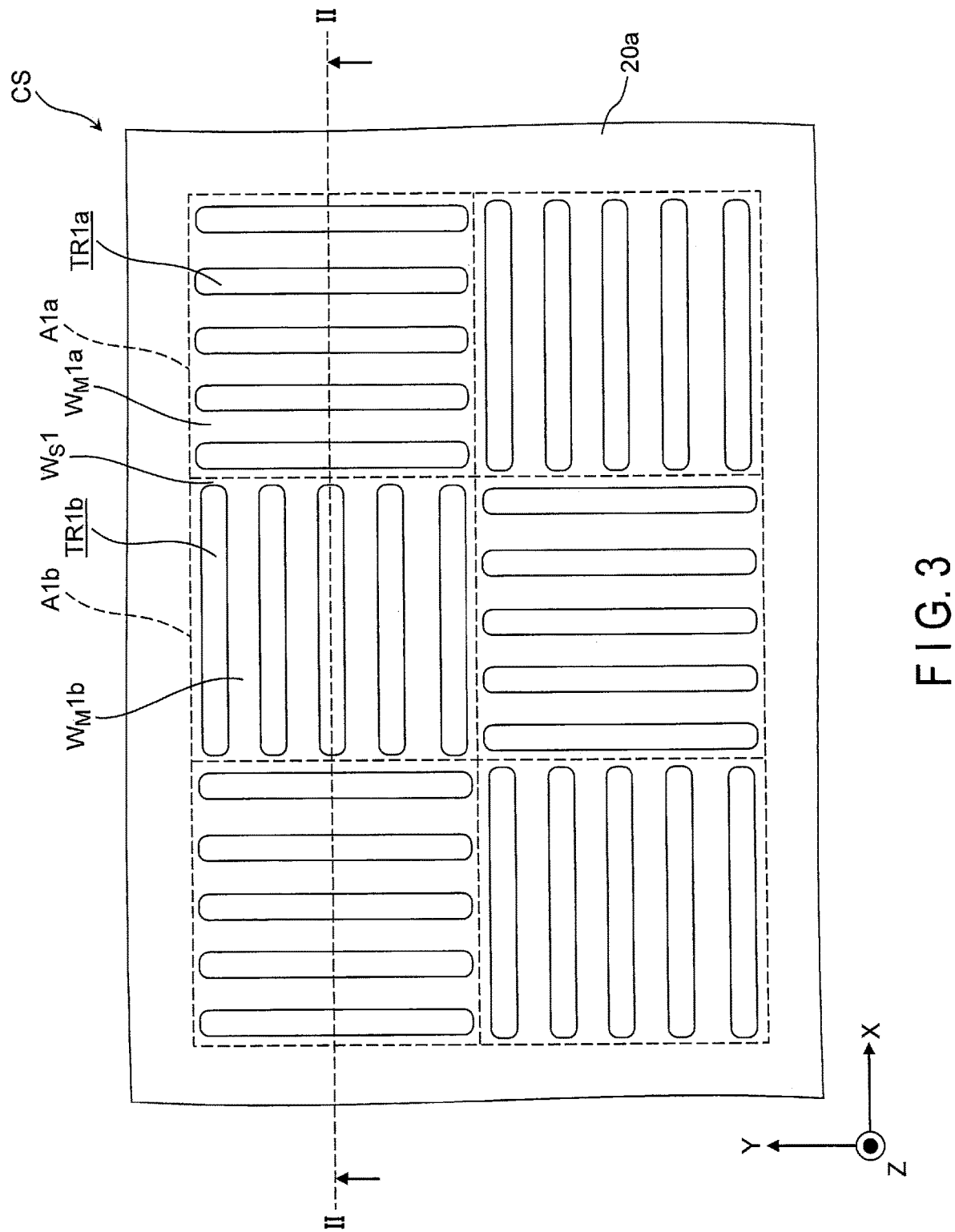
FIG. 3 is a top view of a conductive substrate included in the capacitor shown in FIGS. 1 and 2.

Here, the first main surface S1 includes a plurality of first sub-regions A1a and A1b shown in FIGS. 2 and 3. The first sub-regions A1a and A1b are arranged in a checkered pattern. That is, the first sub-regions A1a and A1b are alternately arranged in the X direction. In addition, each of the first sub-regions A1a is adjacent to one of the first sub-regions A1b in the Y direction as shown in FIG. 3. Specifically, the first sub-regions A1a and A1b form an array of two rows and three columns at a central part of the first main surface S1.

Each of the first sub-regions A1a is provided with a plurality of first recesses TR1a. In each of the first sub-regions A1a, the first recesses TR1a each has a shape extending in the Y direction and are arranged in the X direction. That is, in each of the first sub-regions A1a, a plurality of trenches each having a shape extending in the Y direction and arranged in the X direction are provided as the first recesses TR1a.

On the other hand, each of the first sub-regions A1b is provided with a plurality of first recesses TR1b. In each of the first sub-regions A1b, the first recesses TR1b each extends in the X direction and are arranged in the Y direction. That is, in each of the first sub-regions A1b, a plurality of trenches each having a shape extending in the X direction and arranged in the Y direction, are provided as the plurality of first recesses TR1b.

Here, the length directions of the first recesses TR1a and TR1b are orthogonal to each other, but may intersect diagonally. In this embodiment, the first sub-regions include two types of the first sub-regions A1a and A1b, which are different from each other in the length direction of the first recesses, but the first sub-regions may further include one or more types of the first sub-regions in which the length direction of the first recesses is different from those of the first sub-regions A1a and A1b. Furthermore, the number of the first sub-regions included in the first main surface S1 is six, but the number of the first sub-regions may be two or more.

The first recesses TR1a are spaced apart from one another. The first recesses TR1b are spaced apart from one another, too. Each of the first recesses TR1b is spaced apart from the first recesses TR1a.

Portions of the conductive substrate CS each sandwiched between one and the other of the adjacent first recesses TR1a are first projections $W_M1a$. The first projections $W_M1a$ each has a shape extending in the Y direction and are arranged in the X direction. That is, each of the first sub-regions A1a is provided with a plurality of wall parts each having a shape extending in the Y direction and the Z direction and arranged in the X direction as the first projections $W_M1a$.

On the other hand, portions of the conductive substrate CS each sandwiched between one and the other of the adjacent first recesses TR1b are first projections $W_M1b$. The first projections $W_M1b$ each has a shape extending in the X direction and are arranged in the Y direction. That is, each of the first sub-regions A1b is provided with a plurality of wall parts each having a shape extending in the X direction and the Z direction and arranged in the Y direction as the first projections $W_M1b$.

Portions of the conductive substrate CS each sandwiched between the first recesses TR1a and the first recesses TR1b at a position of each boundary between the first sub-region A1a and the first sub-region A1b are first auxiliary wall parts $W_S1$. The first auxiliary wall part $W_S1$ integrates adjacent first projections $W_M1a$ and also integrates adjacent first projections $W_M1b$, and serves to suppress collapse thereof. The first recesses TR1a and TR1b may be arranged so as not to generate the first auxiliary wall part $W_S1$.

The "length direction" of the first recesses or the first projections is a length direction of orthogonal projections of the first recesses or the first projections onto a plane perpendicular to the thickness direction of the conductive substrate. Similarly, the "length direction" of second recesses or second projections, to be described later, is a length direction of orthogonal projections of the second recesses or the second projections onto a plane perpendicular to the thickness direction of the conductive substrate.

A length of an opening of the first recess is within a range of 10 μm to 500 μm according to an example, and within a range of 50 μm to 100 μm according to another example.

A width of the opening of the first recess, i.e., a distance between the first projections adjacent in the width direction, is preferably 0.3 μm or more. When this width or distance is reduced, a larger electric capacitance can be achieved. However, if this width or distance is reduced, it becomes difficult to form a stacked structure including the dielectric layer 30 and the conductive layer 20b in the first recesses.

A depth of the first recesses and a height of the first projections is within a range of 10 μm to 300 μm according to an example, and within a range of 50 μm to 100 μm according to another example.

A distance between the first recesses adjacent in the width direction, i.e., a thickness of the first projection is preferably 0.1 μm or more. When this distance or thickness is reduced, a larger electric capacitance can be achieved. However, if this distance or thickness is reduced, the first projections are likely to be damaged.

Here, cross sections of the first recesses TR1a and TR1b perpendicular to the length directions are rectangular. However, these cross sections need not be rectangular and may have, for example, a tapered shape.

As shown in FIG. 2, the conductive substrate CS includes a substrate 10 and a conductive layer 20a.

The substrate 10 has the same shape as that of the conductive substrate CS. The substrate 10 is, for example, an insulating substrate, a semiconductor substrate, or a conducting substrate. The substrate 10 is preferably a semiconductor substrate. The substrate 10 is preferably a substrate containing silicon such as a silicon substrate. Such a substrate can be processed using semiconductor processes.

The conductive layer 20a is provided on the substrate 10. The conductive layer 20a is made of, for example, polysilicon doped with impurities to improve the electrical conductivity, or a metal or alloy such as molybdenum, aluminum, gold, tungsten, platinum, nickel, or copper. The conductive layer 20a may have a single-layer structure or a multi-layer structure.

A thickness of the conductive layer 20a is preferably within a range of 0.05 μm to 1 μm, and more preferably within a range of 0.1 μm to 0.3 μm. If the conductive layer 20a is thin, the possibility exists that a discontinuous portion may be generated in the conductive layer 20a, or a sheet resistance of the conductive layer 20a may be excessively increased. When the conductive layer 20a is thickened, manufacturing costs increase.

Here, the substrate 10 is a semiconductor substrate such as a silicon substrate, and the conductive layer 20a is a high-concentration doped layer that is a surface region of the semiconductor substrate doped with impurities at a high concentration. In this case, the first projections, if thin enough, can be entirely doped with impurities at a high concentration.

If the substrate 10 has high electrical conductivity, the conductive layer 20a may be omitted, and the substrate 10 may be used as the conductive substrate CS. For example, if the substrate 10 is a semiconductor substrate made of a semiconductor doped with P-type or N-type impurities, or a metal substrate, the conductive layer 20a can be omitted. In this case, at least a surface region of the substrate 10, e.g. the entire substrate 10, serves as the conductive layer 20a.

The conductive layer 20b serves as an upper electrode of the capacitor. The conductive layer 20b is provided on the first sub-regions A1a and A1b, and covers sidewalls and bottom surfaces of the first recesses TR1a and TR1b.

The conductive layer 20b is made of, for example, polysilicon doped with impurities to improve the electrical conductivity, or a metal or alloy such as molybdenum, aluminum, gold, tungsten, platinum, nickel, or copper. The conductive layer 20b may have a single-layer structure or a multi-layer structure.

A thickness of the conductive layer 20b is preferably within a range of 0.05 μm to 1 μm, and more preferably within a range of 0.1 μm to 0.3 μm. If the conductive layer 20b is thin, there is a possibility that a discontinuous portion may be generated in the conductive layer 20b, or a sheet resistance of the conductive layer 20b may be excessively increased. If the conductive layer 20b is thick, it may be difficult to form the conductive layer 20a and the dielectric layer 30 with sufficient thicknesses.

In FIG. 2, the conductive layer 20b is provided so that the first recesses TR1a and TR1b are completely filled with the conductive layer 20b and the dielectric layer 30. The conductive layer 20b may be a layer that is conformal to a surface of the conductive substrate CS. That is, the conductive layer 20b may be a layer having an approximately uniform thickness. In this case, the first recesses TR1a and TR1b are not completely filled with the conductive layer 20b and the dielectric layer 30.

The dielectric layer 30 is interposed between the conductive substrate CS and the conductive layer 20b. The dielectric layer 30 is a layer that is conformal to the surface of the conductive substrate CS. The dielectric layer 30 electrically insulates the conductive substrate CS and the conductive layer 20b from each other.

The dielectric layer 30 is made of, for example, an organic dielectric or an inorganic dielectric. As the organic dielectric, for example, polyimide can be used. As the inorganic dielectric, a ferroelectric can be used. Paraelectrics such as silicon nitride, silicon oxide, silicon oxynitride, titanium oxide, and tantalum oxide, are preferable. These paraelectrics have a small change in dielectric constant with temperature. Therefore, when the paraelectrics are used for the dielectric layer 30, the heat resistance of the capacitor 1 can be improved.

A thickness of the dielectric layer 30 is preferably within a range of 0.005 μm to 0.5 μm, and more preferably within a range of 0.01 μm to 0.1 μm. When the dielectric layer 30 is thin, there is a possibility that a discontinuous portion may be generated in the dielectric layer 30, and the conductive substrate CS and the conductive layer 20b may be short-circuited. Further, if the dielectric layer 30 is thinned, a withstand voltage is lowered even if there is no short circuit, and a possibility of short-circuiting when a voltage is applied is increased. When the dielectric layer 30 is thickened, the withstand voltage increases, but the electric capacitance decreases.

The dielectric layer 30 is opened at a position of a peripheral region of the first main surface S1 that surrounds the array of the first sub-regions A1a and A1b. That is, the dielectric layer 30 allows the conductive layer 20a to be exposed at this position. Here, the portion of the dielectric layer 30 that is provided on the first main surface S1 is opened in a frame shape.

This capacitor 1 further includes an insulating layer 60, a first internal electrode 70a, a second internal electrode 70b, a first external electrode 70c, and a second external electrode 70d.

The first internal electrode 70a is provided on the first sub-regions A1a and A1b. The first internal electrode 70a is electrically connected to the conductive layer 20b. Here, the first internal electrode 70a is a rectangular electrode located at a center of the first main surface S1.

The second internal electrode 70b is provided on a peripheral region of the first main surface S1 that surrounds the array of the first sub-regions A1a and A1b. The second internal electrode 70b is in contact with the conductive substrate CS at a position of the opening provided in the dielectric layer 30. Thereby, the second internal electrode 70b is electrically connected to the conductive substrate CS. Here, the second internal electrode 70b is a frame-shaped electrode arranged to surround the first internal electrode 70a.

The first internal electrode 70a and the second internal electrode 70b may have a single-layer structure or a multi-layer structure. Each layer constituting the first internal electrode 70a and the second internal electrode 70b is made of, for example, a metal such as molybdenum, aluminum, gold, tungsten, platinum, copper, nickel, or an alloy containing one or more of them.

The insulating layer 60 covers portions of the conductive layer 20b and the dielectric layer 30 that are located on the first main surface S1, and further covers the first internal electrode 70a and the second internal electrode 70b. The insulating layer 60 partially opens at a position of a part of the first internal electrode 70a and a position of a part of the second internal electrode 70b.

The insulating layer 60 may have a single-layer structure or a multi-layer structure. Each layer constituting the insulating layer 60 is made of, for example, an inorganic insulator such as silicon nitride and silicon oxide, or an organic insulator such as polyimide and novolac resin.

The first external electrode 70c is provided on the insulating layer 60. The first external electrode 70c is in contact with the first internal electrode 70a at a position of one or more openings provided in the insulating layer 60. Thereby, the first external electrode 70c is electrically connected to the first internal electrode 70a. In FIG. 1, a region 70R1 is a region where the first external electrode 70c and the first internal electrode 70a are in contact with each other.

The second external electrode 70d is provided on the insulating layer 60. The second external electrode 70d is in contact with the second internal electrode 70b at a position of the remaining opening(s) provided in the insulating layer 60. Thereby, the second external electrode 70d is electrically connected to the second internal electrode 70b. In FIG. 1, a region 70R2 is a region where the second external electrode 70d and the second internal electrode 70b are in contact with each other.

The first external electrode 70c has a stacked structure including a first metal layer 70c1 and a second metal layer 70c2. The second external electrode 70d has a stacked structure including a first metal layer 70d1 and a second metal layer 70d2.

The first metal layers 70c1 and 70d1 are made of, for example, copper. The second metal layers 70c2 and 70d2 cover upper and end surfaces of the first metal layers 70c1 and 70d1, respectively. The second metal layers 70c2 and 70d2 are constituted by, for example, a stacked film of a nickel or nickel alloy layer and a gold layer. The second metal layers 70c2 and 70d2 can be omitted.

The first external electrode 70c or the first internal electrode 70a may further include a barrier layer at a position adjacent to an interface therebetween. The second external electrode 70d or the second internal electrode 70b may further include a barrier layer at a position adjacent to an interface therebetween, too. As a material of the barrier layer, for example, titanium can be used.

This capacitor 1 is, for example, manufactured by the following method. An example of a method of manufacturing the capacitor 1 will be described below with reference to FIGS. 4 to 6.

In this method, the substrate 10 shown in FIG. 4 is first prepared. Here, as an example, it is supposed that the substrate 10 is a single-crystal silicon wafer. A plane orientation of the single-crystal silicon wafer is not particularly limited, but in this embodiment, a silicon wafer whose main surface is a (100) plane is used. As the substrate 10, a silicon wafer whose main surface is a (110) plane can also be used.

Next, the recesses are formed on the substrate 10 by MacEtch (Metal-Assisted Chemical Etching).

That is, as shown in FIG. 4, a catalyst layer 80 containing a noble metal is first formed on the substrate 10. The catalyst layer 80 is formed so as to partially cover one main surface (hereinafter, referred to as the "first surface") of the substrate 10.

Specifically, a mask layer 90 is first formed on the first surface of the substrate 10.

The mask layer 90 is opened at positions corresponding to the first recesses TR1a and TR1b. The mask layer 90 prevents a noble metal, to be described later, from coming into contact with portions of the first surface that are covered with the mask layer 90.

Examples of the material of the mask layer 90 include organic materials such as polyimide, fluororesin, phenol resin, acrylic resin, and novolac resin, and inorganic materials such as silicon oxide and silicon nitride.

The mask layer 90 can be formed by, for example, existing semiconductor processes. The mask layer 90 made of an organic material can be formed by, for example, photolithography. The mask layer 90 made of an inorganic material can be formed by, for example, deposition of an inorganic material layer by vapor deposition, formation of a mask by photolithography, and patterning of the inorganic material layer by etching. Alternatively, the mask layer 90 made of an inorganic material can be formed by oxidation or nitriding of the surface region of the substrate 10, formation of a mask by photolithography, and patterning of an oxide or nitride layer by etching. The mask layer 90 can be omitted.

Next, the catalyst layer 80 is formed on regions of the first surface that are not covered with the mask layer 90. The catalyst layer 80 is, for example, a discontinuous layer containing a noble metal. Here, as an example, it is supposed that the catalyst layer 80 is a particulate layer formed of catalyst particles 81 containing a noble metal.

The noble metal is, for example, one or more of gold, silver, platinum, rhodium, palladium, and ruthenium. The catalyst layer 80 and the catalyst particles 81 may further contain a metal other than a noble metal such as titanium.

The catalyst layer 80 can be formed by, for example, electroplating, reduction plating, or displacement plating. The catalyst layer 80 can also be formed by application of a dispersion containing noble metal particles, or vapor deposition such as evaporation or sputtering. Of these methods, the displacement plating is particularly favorable because it is possible to directly and evenly deposit the noble metal on the regions of the first surface that are not covered with the mask layer 90.

Next, the substrate 10 is etched with an assist from a noble metal as a catalyst to form the recesses on the first surface.

Specifically, as shown in FIG. 5, the substrate 10 is etched with an etching agent 100. For example, the substrate 10 is immersed in the etching agent 100 in liquid form to bring the etching agent 100 into contact with the substrate 10.

The etching agent 100 contains an oxidizer and hydrogen fluoride.

The concentration of hydrogen fluoride in the etching agent 100 is preferably within a range of 1 mol/L to 20 mol/L, more preferably within a range of 5 mol/L to 10 mol/L, and further preferably within a range of 3 mol/L to 7 mol/L. When the hydrogen fluoride concentration is low, it is difficult to achieve a high etching rate. When the hydrogen fluoride concentration is high, excess side etching may occur.

The oxidizer can be selected from, for example, hydrogen peroxide, nitric acid, $AgNO_3$, $KAuCl_4$, $HAuCl_4$, $K_2PtCl_6$, $H_2PtCl_6$, $Fe(NO_3)_3$, $Ni(NO_3)_2$, $Mg(NO_3)_2$, $Na_2S_2O_8$, $K_2S_2O_8$, $KMnO_4$, and $K_2Cr_2O_7$. Hydrogen peroxide is favorable as the oxidizer because no harmful byproduct is produced, and a semiconductor element is not contaminated.

The concentration of the oxidizer in the etching agent 100 is preferably within a range of 0.2 mol/L to 8 mol/L, more preferably within a range of 2 mol/L to 4 mol/L, and further preferably within a range of 3 mol/L to 4 mol/L.

The etching agent 100 may further contain a buffer. The buffer contains, for example, at least one of ammonium fluoride and ammonia. As an example, the buffer is ammonium fluoride. As another example, the buffer is a mixture of ammonium fluoride and ammonia.

The etching agent 100 may further contain other components such as water.

When such an etching agent 100 is used, the material of the substrate 10, i.e. silicon in this embodiment, is oxidized only in regions of the substrate 10 that are close to the catalyst particles 81. Oxide generated thereby is dissolved and removed by hydrofluoric acid. Therefore, only the portions close to the catalyst particles 81 are selectively etched.

The catalyst particles 81 move toward the other main surface (hereinafter, referred to as the "second surface") of the substrate 10 with the progress of etching, where etching similar to the above is performed. As a result, as shown in FIG. 5, at the position of the catalyst layer 80, etching proceeds from the first surface toward the second surface in a direction perpendicular to the first surface.

Figure 6:
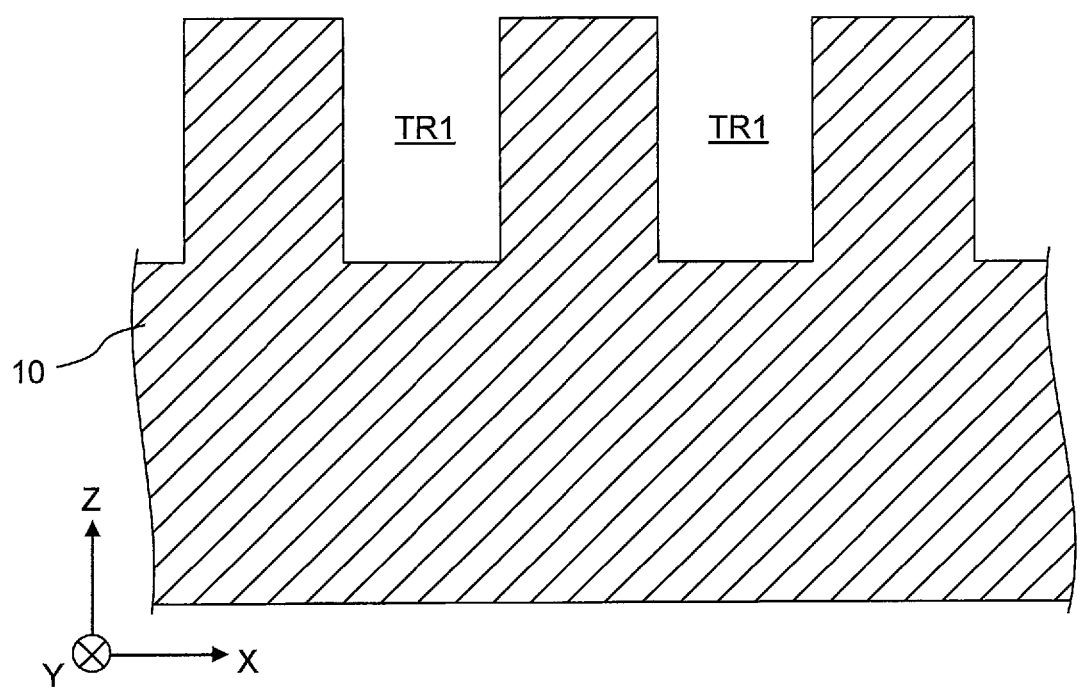
FIG. 6 is a cross-sectional view showing a structure obtained by the processes of FIGS. 4 and 5.

In this way, the first recesses TR1 shown in FIG. 6 are formed on the first surface as the first recesses TR1a and TR1b.

Thereafter, the mask layer 90 and the catalyst layer 80 are removed from the substrate 10.

Next, the conductive layer 20a shown in FIG. 2 is formed on the substrate 10 to obtain the conductive substrate CS. The conductive layer 20a can be formed by, for example, doping the surface region of the substrate 10 with impurities at a high concentration. The conductive layer 20a made of polysilicon can be formed by, for example, LPCVD (low pressure chemical vapor deposition). The conductive layer 20a made of metal can be formed by, for example, electrolytic plating, reduction plating, or displacement plating.

A plating solution is a liquid containing a salt of a metal to be plated. As the plating solution, a general plating solution such as a copper sulfate plating solution containing copper sulfate pentahydrate and sulfuric acid, a copper pyrophosphate plating solution containing copper pyrophosphate and potassium pyrophosphate, and a nickel sulfamate plating solution containing nickel sulfamate and boron, can be used.

The conductive layer 20a is preferably formed by a plating method using a plating solution containing a salt of a metal to be plated, a surfactant, and carbon dioxide in a supercritical or subcritical state. In this plating method, the surfactant is interposed between particles made of supercritical carbon dioxide and a continuous phase of a solution containing a salt of a metal to be plated. That is, the surfactant is allowed to form micelles in the plating solution, and supercritical carbon dioxide is incorporated in these micelles.

In a normal plating method, the supply of the metal to be plated may be insufficient in the vicinity of the bottom portions of the recesses. This is particularly noticeable when a ratio D/W of the depth D to a width or diameter W of the recesses is large.

The micelles incorporating supercritical carbon dioxide can easily enter narrow gaps. As the micelles move, so does the solution containing a salt of a metal to be plated. Therefore, according to a plating method using a plating solution containing a salt of a metal to be plated, a surfactant, and carbon dioxide in a supercritical or subcritical state, the conductive layer 20a having a uniform thickness can be easily formed.

Next, the dielectric layer 30 is formed on the conductive layer 20a. The dielectric layer 30 can be formed by, for example, CVD (chemical vapor deposition). Alternatively, the dielectric layer 30 can be formed by oxidizing, nitriding, or oxynitriding the surface of the conductive layer 20a.

Next, the conductive layer 20b is formed on the dielectric layer 30. As the conductive layer 20b, for example, a conductive layer made of polysilicon or metal is formed. Such a conductive layer 20b can be formed by, for example, the same method as described above for the conductive layer 20a.

Next, an opening is formed on the dielectric layer 30. The opening is formed at a position of a peripheral region of the first main surface S1 that surrounds the array of the first sub-regions A1a and A1b. Here, a portion of the dielectric layer 30 that is located on the first main surface S1 is opened in a frame shape. This opening can be formed by, for example, formation of a mask by photolithography and patterning by etching.

Next, a metal layer is formed and patterned to obtain the first internal electrode 70a and the second internal electrode 70b. The first internal electrode 70a and the second internal electrode 70b can be formed by, for example, a combination of film formation by sputtering or plating, and photolithography.

Thereafter, the insulating layer 60 is formed. The insulating layer 60 is opened at the positions corresponding to a part of the first internal electrode 70a and a part of the second internal electrode 70b. The insulating layer 60 can be formed by, for example, a combination of film formation by CVD and photolithography.

Next, the first external electrode 70c and the second external electrode 70d are formed on the insulating layer 60. Specifically, the first metal layers 70c1 and 70d1 are formed first. Next, the second metal layers 70c2 and 70d2 are formed. The first metal layers 70c1 and 70d1 and the second metal layers 70c2 and 70d2 can be formed by, for example, a combination of film formation by sputtering or plating, and photolithography.

Thereafter, the structure thus obtained is diced. In the manner described above, the capacitor 1 shown in FIGS. 1 and 2 is obtained.

In the above-described method, the first recesses TR1a and TR1b are formed using MacEtch, but at least one of the first recesses TR1a and TR1b may be formed by other methods. For example, when forming recesses with small depths or forming recesses with large widths or diameters to be sufficiently distant from one another, an etching method other than MacEtch, such as reactive ion etching (RIE), may be used.

In this capacitor 1, the first recesses TR1a and TR1b are provided on the first main surface S1, and the stacked structure including the dielectric layer 30 and the conductive layer 20b is provided not only on the first main surface S1 but also in these first recesses TR1a and TR1b. Therefore, this capacitor 1 can achieve a large electric capacitance.

In addition, in a case where all the first recesses provided on the first main surface S1 have the same length direction, the conductive substrate CS is easy to warp in the width direction of the first recesses. In contrast, in this capacitor 1, a plurality of first sub-regions A1a and A1b are arranged on the first main surface S1, and the length directions of the first recesses TR1a and TR1b provided in the first sub-regions A1a and A1b, respectively, are made different. That is, the direction in which the conductive substrate CS is easy to warp is different between portions corresponding to the first sub-regions A1a and portions corresponding to the first sub-regions A1b. Therefore, this capacitor 1 is difficult to warp, and the conductive substrate CS is also difficult to warp in the manufacturing process of the capacitor 1.

That is, this capacitor 1 can achieve a large electric capacitance, and is difficult to warp.

Various modifications can be made in this capacitor 1.

(First Modification)

FIG. 7 is a perspective view of a conductive substrate included in a capacitor according to a first modification.

The capacitor according to the first modification is the same as the capacitor 1 according to the first embodiment except that the following structure is adopted in the conductive substrate CS.

That is, in the capacitor according to the first modification, the first recesses TR1a in each of the first sub-regions A1a are trenches each extending in the Y direction. These first recesses TR1a form a plurality of rows each of which includes two or more first recesses TR1a arranged in the Y direction and which are arranged in the X direction.

Portions of the conductive substrate CS each sandwiched between these rows are the first projections $W_M1a$. Portions of the conductive substrate CS each sandwiched between the first recesses TR1a arranged in the Y direction are first auxiliary wall parts $W_S1a$ each integrating adjacent first projections $W_M1a$.

In this way, in the capacitor according to the first modification, the first recesses TR1a are arranged not only in the X direction but also in the Y direction so that the number of the first auxiliary wall parts is increased. Accordingly, the first projections $W_M1a$ are harder to collapse in this capacitor.

The capacitor according to the first modification can achieve substantially the same electric capacitance as that of the capacitor 1 according to the first embodiment, and is difficult to warp.

Furthermore, in the capacitor according to the first modification, positions of the first auxiliary wall parts $W_S1a$ are different between two adjacent rows each formed of the first recesses TR1a. Here, the "positions of the first auxiliary wall parts" are positions in the Y direction. When this configuration is adopted, it is possible to suppress occurrence of large variation in depth of the first recesses TR1a as will be described below.

In the above method, the catalyst layer 80 is formed by, for example, plating. In this case, the material of the catalyst layer 80 is supplied from the plating solution.

In a region where an area proportion of the openings in the mask layer 90 is small, the amount of the above material to be supplied to the first surface exposed at the positions of the openings is larger than a region where the area proportion of the openings in the mask layer 90 is large. Therefore, in the region where the area proportion of the openings in the mask layer 90 is small, the amount of the catalyst particles 81 per unit area of the catalyst layer 80 is larger than the region where the area proportion of the openings in the mask layer 90 is large.

The amount of the catalyst particles affects an etching rate. That is, the larger the amount of the catalyst particles, the higher the etching rate.

In a case of adopting a structure in which the positions of the first auxiliary wall parts $W_S1a$ are coincident between the two adjacent rows each formed of the first recesses TR1$a$, a difference in the area proportion of the openings in the mask layer 90 is large between regions in the vicinity of the positions corresponding to the first auxiliary wall parts $W_S1a$ and the other regions. In this case, therefore, a large difference is generated in the depth of the first recesses TR1$a$ between the regions in the vicinity of the first auxiliary wall parts $W_S1a$ and the other regions.

In the arrangement shown in FIG. 7, the positions of the first auxiliary wall parts $W_S1a$ are different between two adjacent rows each formed of the first recesses TR1$a$. Thus, a difference in the area proportion of the openings in the mask layer 90 between the regions in the vicinity of the positions corresponding to the first auxiliary wall parts $W_S1a$ and the other regions is smaller than the case where the positions of the first auxiliary wall parts $W_S1a$ are made coincident between two adjacent columns each formed of the first recesses TR1$a$. When the arrangement shown in FIG. 7 is adopted, therefore, variation in depth of the first recesses TR1$a$ can be made small.

In addition, in the case of adopting the arrangement shown in FIG. 7, in film formation to be performed after the first recesses TR1$a$ are formed, for example, deposited materials can be supplied more uniformly. Thus, a high film thickness uniformity can be achieved.

The positions of the first auxiliary wall parts $W_S1a$ may be coincident between two adjacent columns each formed of the first recesses TR1$a$. In this case, the variation in depth of the first recesses TR1$a$ cannot be made as small as in the case of adopting the arrangement of FIG. 7. However, it is possible to make the first projections $W_M1a$ difficult to collapse.

Also in the first sub-regions A1$b$, an arrangement similar to that described with reference to FIG. 7 can be adopted.

That is, in such an arrangement, the first recesses TR1$b$ of each of the first sub-regions A1$b$ are trenches each extending in the X direction. These first recesses TR1$b$ are arranged so as to form a plurality of rows each of which includes two or more first recesses TR1$b$ arranged in the X direction and which are arranged in the Y direction. Then, positions of portions of the conductive substrate CS each sandwiched between the first recesses TR1$b$ arranged in the X direction are made different between two adjacent rows each formed of the first recesses TR1$b$.

In a case of adopting such an arrangement, it is possible to make the collapse of the first projections less prone to occur, decrease the variation in depth of the first recesses TR1$b$, and achieve a high film thickness uniformity also in the first sub-regions A1$b$. It is noted that in the first sub regions A1$b$, the positions of the first auxiliary wall parts may be coincident between two adjacent columns each formed of the first recesses TR1$b$.

(Second Modification)

Figure 8:
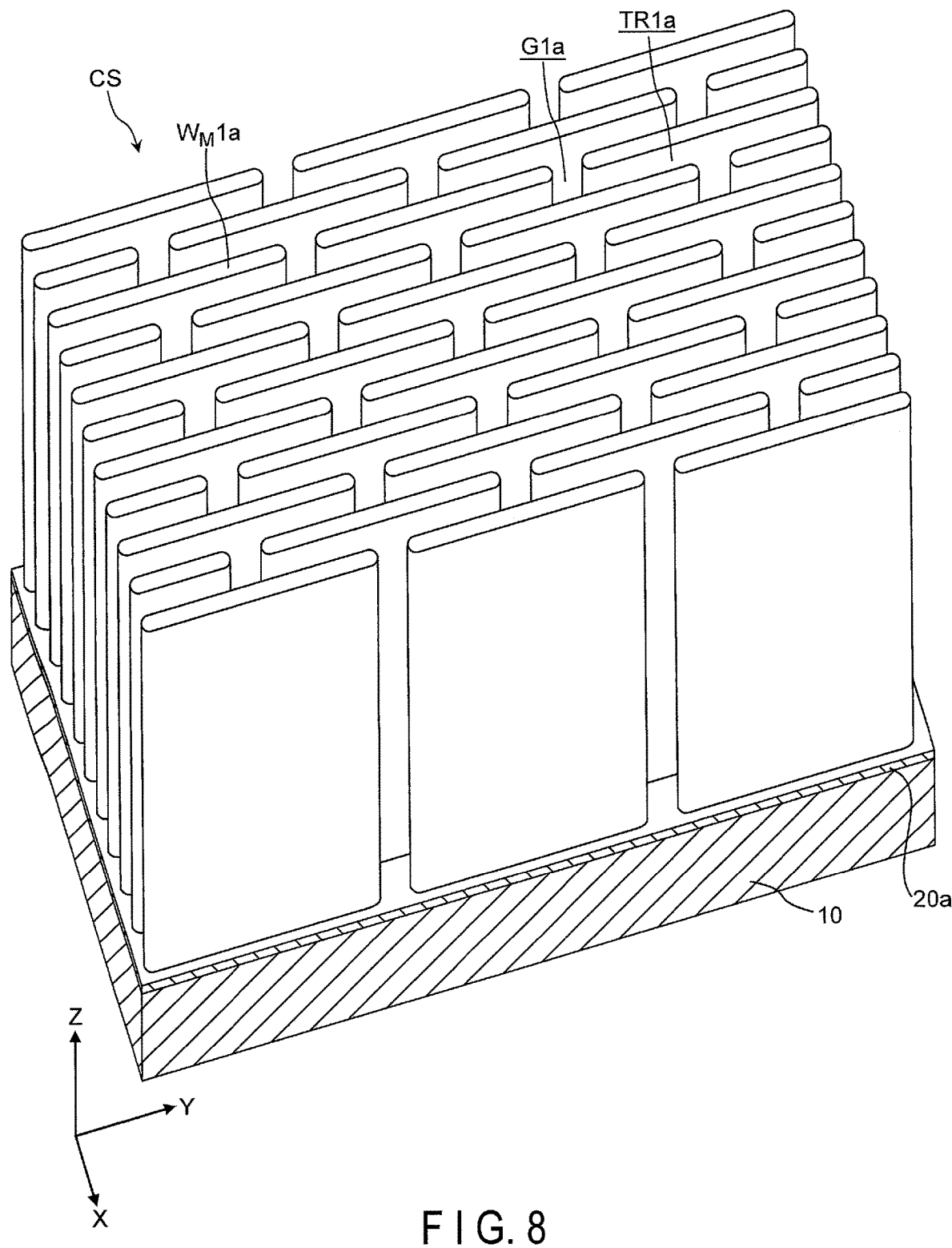
FIG. 8 is a perspective view of a conductive substrate included in a capacitor according to a second modification.

FIG. 8 is a perspective view of a conductive substrate included in a capacitor according to a second modification.

The capacitor according to the second modification is the same as the capacitor 1 according to the first embodiment, with the exception that the following structure is adopted in the conductive substrate CS.

That is, in the capacitor according to the second modification, each of the first sub-regions A1$a$ is further provided with recesses G1$a$ each connecting the first recesses TR1$a$ that are adjacent in the X direction. Thereby, in each of the first sub-regions A1$a$, the first projections $W_M1a$ form a plurality of rows each of which is constituted by two or more first projections $W_M1a$ arranged in the Y direction and which are arranged in the X direction.

The capacitor according to the second modification can achieve substantially the same electric capacitance as that of the capacitor 1 according to the first embodiment, and is difficult to warp.

In addition, in the capacitor according to the second modification, the first projections $W_M1a$ are divided into a plurality of portions by the recesses G1$a$. Thus, in this capacitor, the first projections $W_M1a$ are difficult to collapse in the event of deformation such as warping as compared with the capacitor 1 according to the first embodiment.

Also in the first sub-regions A1$b$, an arrangement similar to that described with reference to FIG. 8 can be adopted.

That is, in such an arrangement, each of the first sub-regions A1$b$ is further provided with recesses each connecting the first recesses TR1$b$ that are adjacent in the Y direction. Thereby, in each of the first sub-regions A1$b$, the first projections form a plurality of rows each of which is constituted by two or more first projections arranged in the X direction and which are arranged in the Y direction.

In a case of adopting such an arrangement, it is possible to make the first projections difficult to collapse in the event of deformation, such as warping, also in the first sub-regions A1$b$.

(Third Modification)

Figure 9:
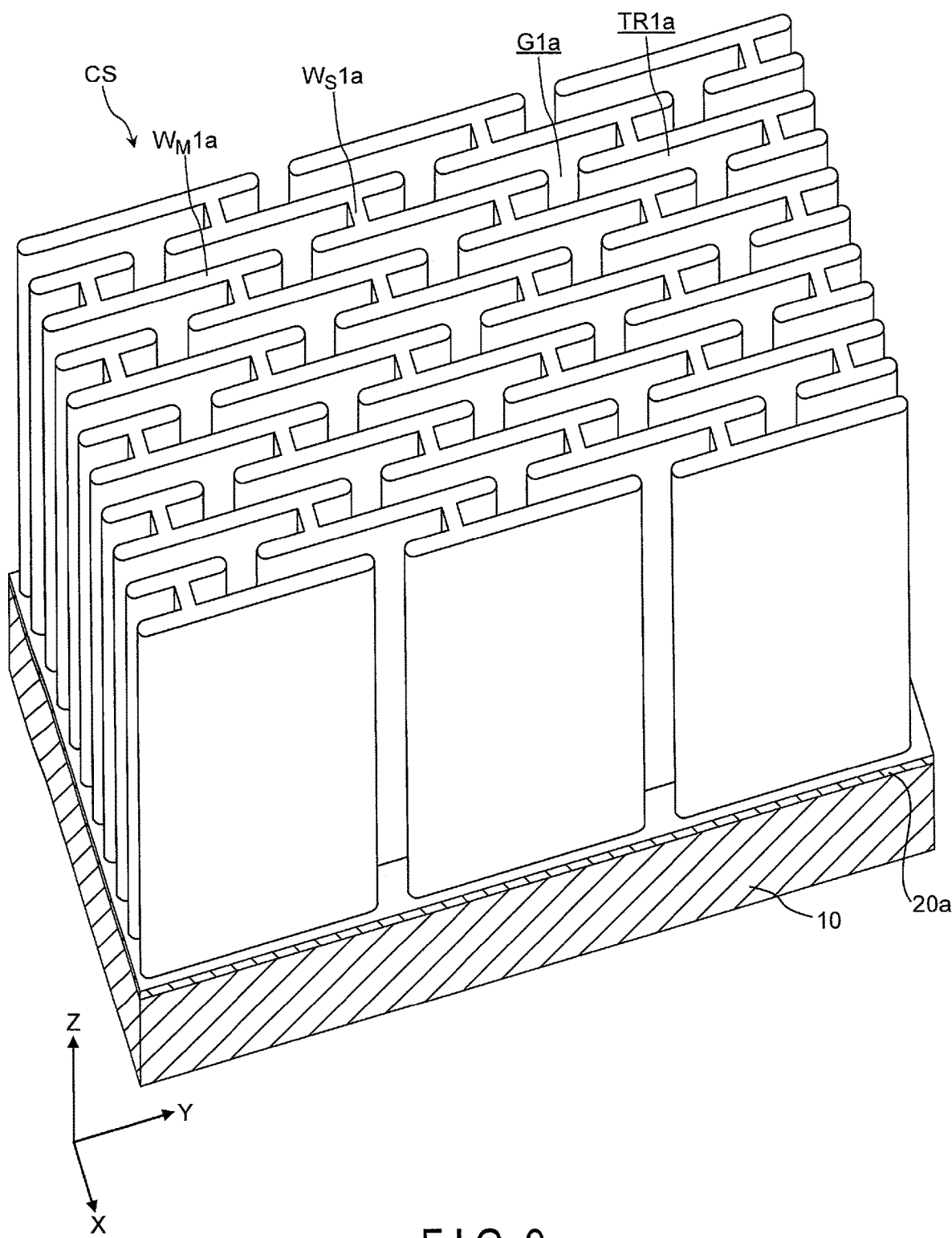
FIG. 9 is a perspective view of a conductive substrate included in a capacitor according to a third modification.

FIG. 9 is a perspective view of a conductive substrate included in a capacitor according to a third modification.

The capacitor according to the third modification is the same as the capacitor according to the second modification except that the following structure is adopted in the conductive substrate CS. That is, in the capacitor according to the third modification, each of the first sub-regions A1$a$ is further provided with the first auxiliary wall parts $W_S1a$ each integrating the first projections $W_M1a$ that are adjacent in the X direction.

The capacitor according to the third modification can achieve substantially the same electric capacitance as that of the capacitor according to the second modification, and is difficult to warp.

In addition, in the capacitor according to the third modification, the first projections $W_M1a$ are divided into a plurality of portions by the recesses G1$a$, and the first auxiliary wall parts $W_S1a$ are further provided. Thus, in this capacitor, the first projections $W_M1a$ are difficult to collapse in the event of deformation such as warping.

Also in the first sub-regions A1$b$, an arrangement similar to that described with reference to FIG. 9 can be adopted.

That is, in such an arrangement, each of the first sub-regions A1$b$ is further provided with recesses each connecting the first recesses TR1$b$ that are adjacent in the Y direction. Thereby, in each of the first sub-regions A1$b$, the first projections form a plurality of rows each of which is constituted by two or more first projections arranged in the X direction and which are arranged in the Y direction. Then, each of the first sub-regions A1$b$ is further provided with the first auxiliary wall parts each integrating the first projections that are adjacent in the Y direction.

In a case of adopting such an arrangement, it is possible to make the first projections difficult to collapse in the event of deformation such as warping also in the first sub-regions A1b.

(Fourth Modification)

Figure 10:
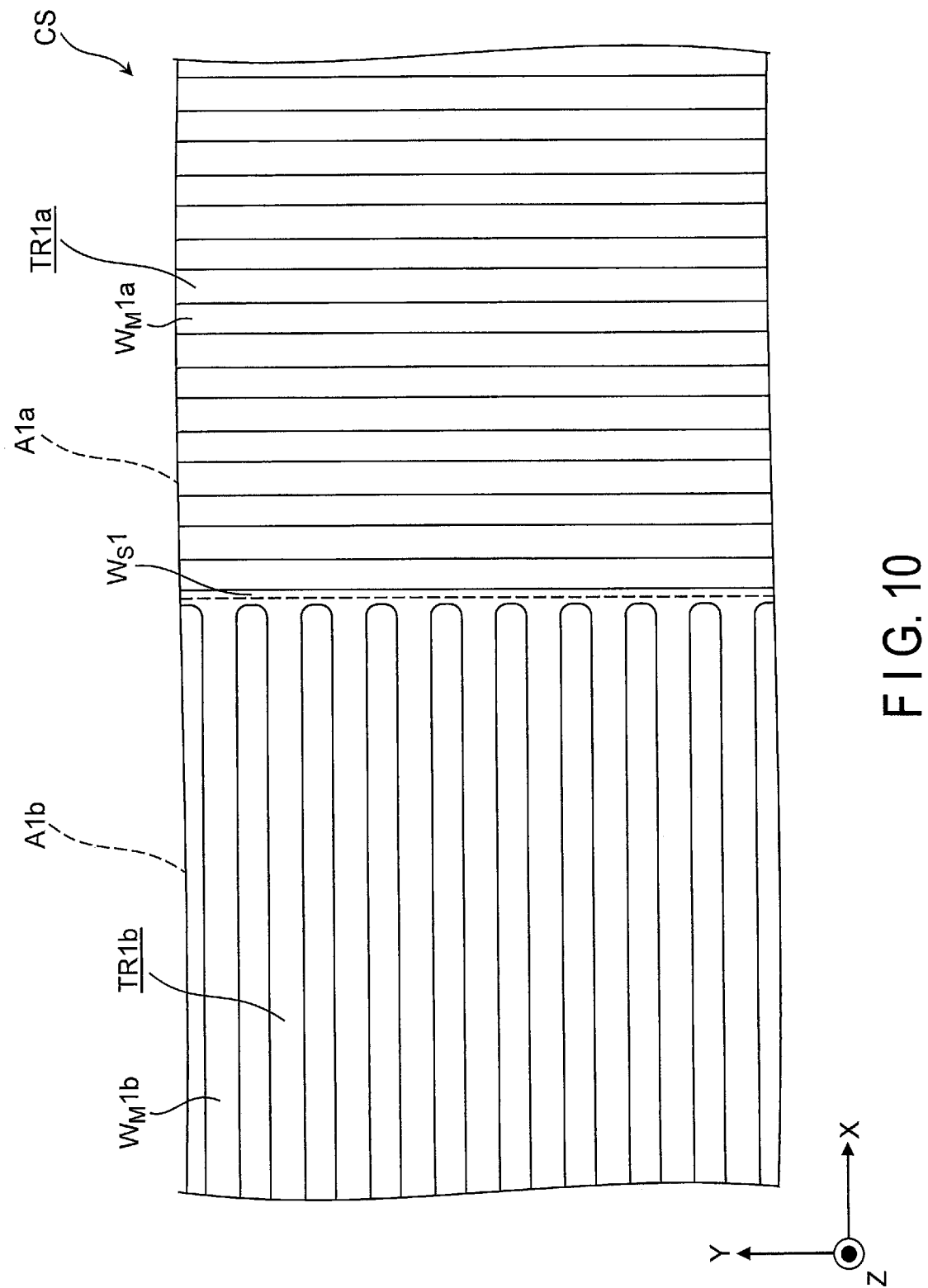
FIG. 10 is a top view showing an example of a relationship between an arrangement of sub-regions and an arrangement of trenches.
Figure 11:
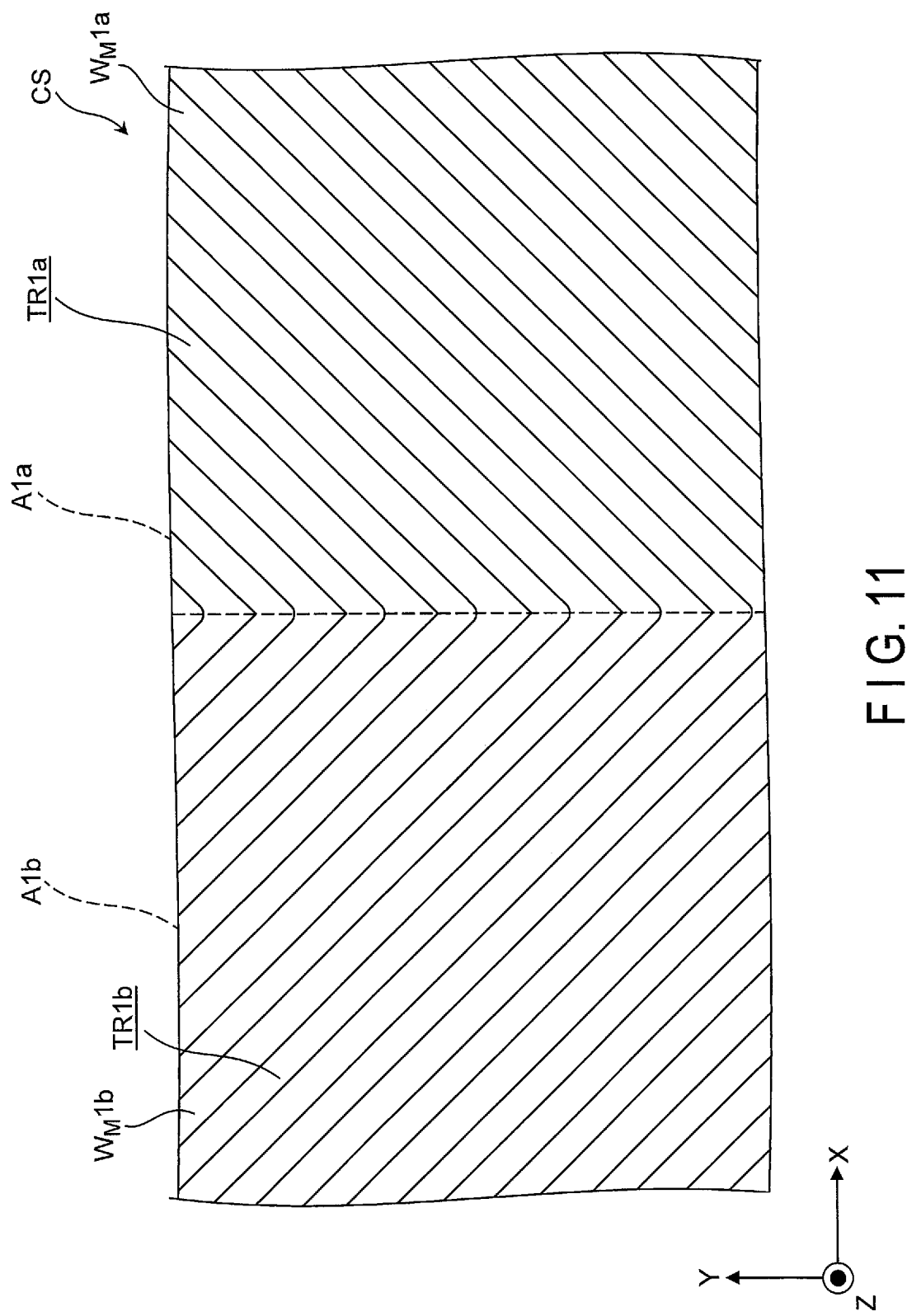
FIG. 11 is a top view showing another example of a relationship between an arrangement of sub-regions and an arrangement of trenches.

FIG. 10 is a top view showing an example of a relationship between an arrangement of sub-regions and an arrangement of trenches. FIG. 11 is a top view showing another example of a relationship between an arrangement of sub-regions and an arrangement of trenches.

A structure of FIG. 10 is approximately the same as the structure shown in FIG. 3. In FIG. 10, the length directions of the first recesses TR1a and TR1b are parallel or perpendicular to a boundary between the first sub-regions A1a and A1b.

In FIG. 11, in contrast, the length directions of the first recesses TR1a and TR1b are inclined with respect to the boundary between the first sub-regions A1a and A1b. Then, one set of ends of the first recesses TR1a provided in the first sub-region Ala and one set of ends of the first recesses TR1b provided in the first sub-region Alb adjacent thereto are connected together. That is, one set of ends of the first projections $W_M1a$ provided in the first sub-region Ala and one set of ends of the first projections $W_M1b$ provided in the first sub-region Alb adjacent thereto are connected together. In the fourth modification, such an arrangement is adopted.

One of the first projections $W_M1a$ and $W_M1b$, the ends of which are connected with each other, serves to suppress collapse of the other. In addition, when the arrangement of FIG. 11 is adopted, there is a possibility that a larger electric capacitance can be achieved than the case of adopting the arrangement of FIG. 10.

Thus, the capacitor according to the fourth modification is unlikely to generate warping or collapse of the first projections in the same manner as the capacitor 1 according to the first embodiment. In addition, there is a possibility that the capacitor according to the fourth modification can achieve a larger electric capacitance than the capacitor 1 according to the first embodiment.

Second Embodiment

Figure 12:
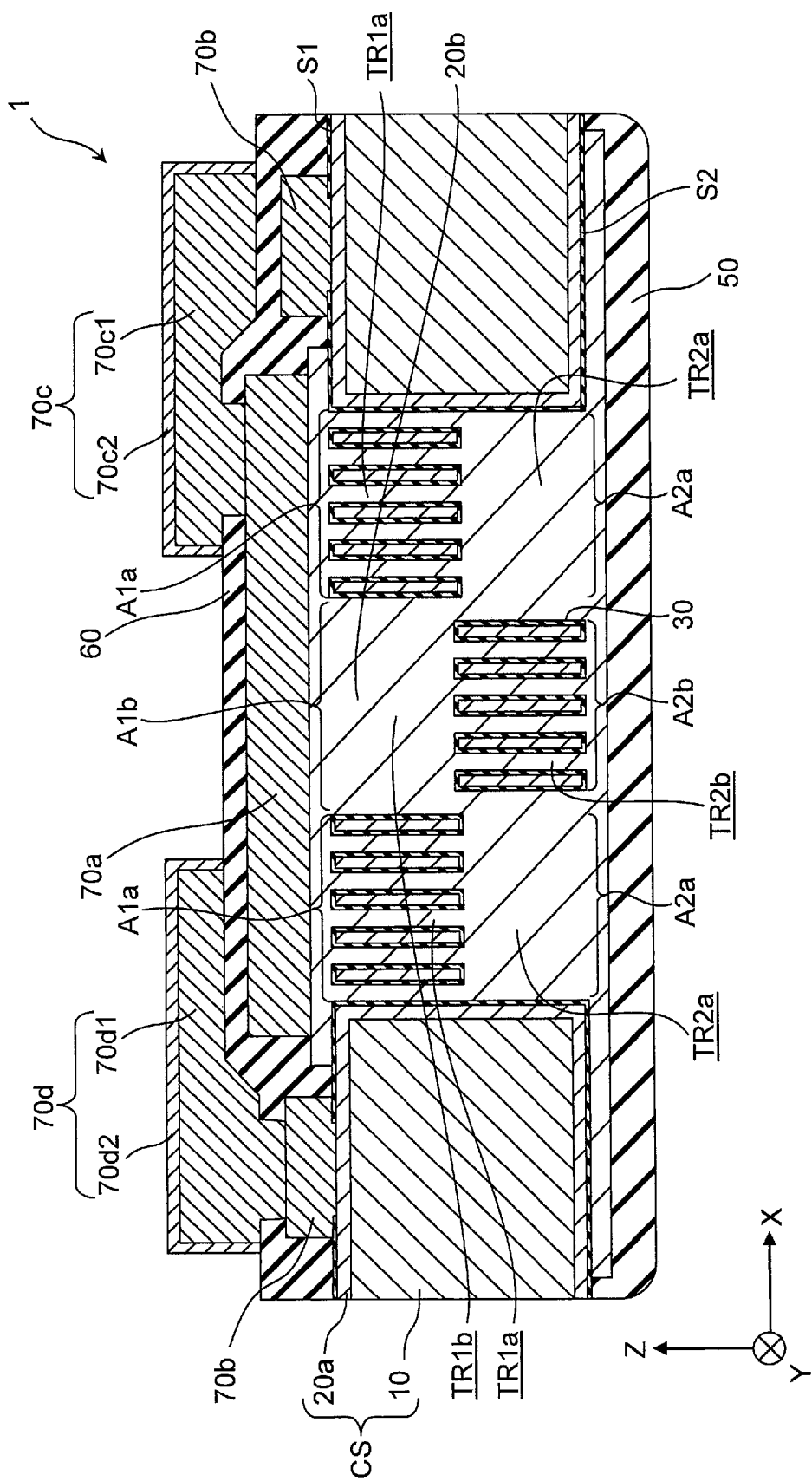
FIG. 12 is a cross-sectional view of a capacitor according to a second embodiment.

FIG. 12 shows a capacitor according to a second embodiment.

A capacitor 1 shown in FIG. 12 is the same as the capacitor 1 according to the first embodiment except that the following configuration is adopted.

That is, the second main surface S2 includes a plurality of second sub-regions. Each of the second sub-regions is provided with a plurality of second recesses each having a shape extending in one direction and arranged in the width direction. One or more second sub-regions and another one or more second sub-regions are different in the length direction of the second recesses.

Figure 13:
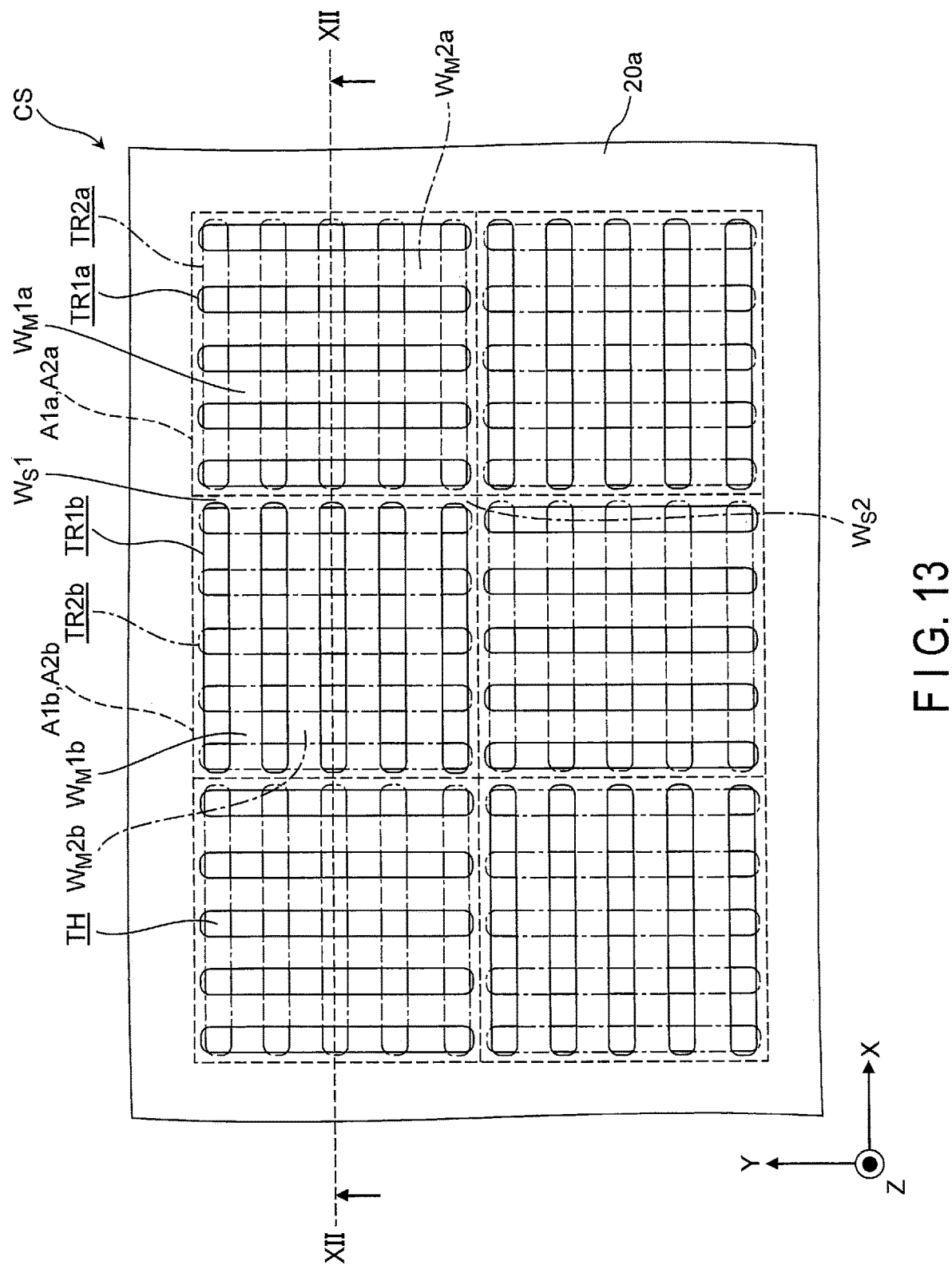
FIG. 13 is a top view of a conductive substrate included in a capacitor shown in FIG. 12.

Here, the second main surface S2 includes a plurality of second sub-regions A2a and A1b shown in FIGS. 12 and 13. The second sub-regions A2a and A2b are arranged in a checkered pattern. That is, the second sub-regions A2a and A2b are arranged alternately in the X direction. Each of the second sub-regions A2a is adjacent to one of the second sub-regions A2b in the Y direction as shown in FIG. 13. Specifically, the second sub-regions A2a and A2b form an array of two rows and three columns at a central portion of the second main surface S2.

In addition, here, the second sub-regions A2a and A2b are arranged at positions corresponding to the first sub-regions A1a and A1b, respectively. That is, orthogonal projections of the second sub-regions A2a and A2b onto a plane perpendicular to the Z direction are equal in position to those of the first sub-regions A1a and A1b onto this plane, respectively.

Each of the second sub-regions A2a is provided with a plurality of second recesses TR2a. In each of the second sub-regions A2a, the second recesses TR2a each has a shape extending in the X direction and are arranged in the Y direction. That is, in each of the second sub-regions A2a, a plurality of trenches each having a shape extending in the X direction and arranged in the Y direction are provided as the second recesses TR2a.

On the other hand, each of the second sub-regions A2b is provided with a plurality of second recesses TR2b. In each of the second sub-regions A2b, the second recesses TR2b each has a shape extending in the Y direction and are arranged in the X direction. That is, in each of the second sub-regions A2b, a plurality of trenches each having a shape extending in the Y direction and arranged in the X direction are provided as the second recesses TR2b.

Here, the length directions of the second recesses TR2a and TR2b are orthogonal to each other, but may intersect diagonally. In addition, here, the second sub-regions include two types of the second sub-regions A2a and A2b, which are different from each other in the length direction of the second recesses, but the second sub-regions may further include one or more types of the second sub-regions in which the length direction of the second recesses is different from those of the second sub-regions A2a and A2b. Furthermore, the number of the second sub-regions included in the second main surface S2 is six, but the number of the second sub-regions may be two or more.

In addition, the length direction of the first recesses TR1a and that of the second recesses TR2a are orthogonal to each other, but may intersect diagonally. Similarly, the length direction of the first recesses TR1b and that of the second recesses TR2b are orthogonal to each other, but may intersect diagonally.

The second recesses TR2a are spaced apart from one another. The second recesses TR2b are spaced apart from one another, too. Each of the second recesses TR2b is spaced apart from the second recesses TR2a.

Portions of the conductive substrate CS each sandwiched between one and the other of adjacent second recesses TR2a are second projections $W_M2a$. The second projections $W_M2a$ each has a shape extending in the X direction and are arranged in the Y direction. That is, each of the second sub-regions A2a is provided with a plurality of wall parts each having a shape extending in the X direction and the Z direction and arranged in the Y direction as the second projections $W_M2a$.

On the other hand, portions of the conductive substrate CS each sandwiched between one and the other of the adjacent second recesses TR2b are second projections $W_M2b$. The second projections $W_M2b$ each has a shape extending in the Y direction and are arranged in the X direction. That is, each of the second sub-regions A2b is provided with a plurality of wall parts each having a shape extending in the Y direction and the Z direction and arranged in the X direction as the second projections $W_M2b$.

Portions of the conductive substrate CS each sandwiched between the second recesses TR2a and the second recesses TR2b at a position of each boundary between the second sub-region A2a and the second sub-region A2b are second auxiliary wall parts $W_S2$. The second auxiliary wall part $W_S2$ integrates adjacent second projections $W_M2a$ and integrates adjacent second projections $W_M2b$, and serves to suppress collapse thereof. The second recesses TR2a and TR2b may be arranged so as not to generate the second auxiliary wall part $W_S2$.

Dimensions for the second recesses and the second projections are preferably within the ranges described above for the first recesses and the first projections, respectively.

A sum of a depth d1 of the first recess and a depth d2 of the second recess, d1+d2, is equal to or greater than a thickness T of the conductive substrate CS. If this configuration is adopted, the first recesses and the second recesses are connected to each other at positions where they intersect to form through holes. Here, the first recesses TR1a and the second recesses TR2a are connected to each other at positions where they intersect to form through holes TH. In addition, the first recesses TR1b and the second recesses TR2b are connected to each other at positions where they intersect to form through holes TH.

A ratio of the sum d1+d2 to the thickness T, (d1+d2)/T, is preferably within a range of 1 to 1.4, and more preferably within a range of 1.1 to 1.3. From the viewpoint of increasing the electric capacitance, the ratio (d1+d2)/T is preferably large. In addition, from the viewpoint of improving an electrical connection between portions of the conductive layer 20b that are located on sidewalls and bottom surfaces of the first recesses and portions of the conductive layer 20b that are located on sidewalls and bottom surfaces of the second recesses, the ratio (d1+d2)/T is preferably large. However, when the depths d1 and d2 are increased, the mechanical strength of the capacitor 1 decreases.

Note that the ratio (d1+d2)/T may be less than 1. In this case, the first recesses and the second recesses do not form the through holes at the positions where they intersect. Therefore, in this case, in addition to providing the first recesses and the second recesses, through holes are provided at any positions of the substrate 10.

The depth d1 and the depth d2 may be the same or different.

A surface of the conductive layer 20a constitutes the first main surface S1, the second main surface S2, the sidewalls and the bottom surfaces of the first recesses TR1a and TR1b, and sidewalls and bottom surfaces of the second recesses TR2a and TR2b. The conductive layer 20b covers the first main surface S1, the second main surface S2, the sidewalls and the bottom surfaces of the first recesses TR1a and TR1b, and the sidewalls and the bottom surfaces of the second recesses TR2a and TR2b.

This capacitor 1 further includes an insulating layer 50. The insulating layer 50 covers a portion of the conductive layer 20b that is located on the second main surface S2 side. The insulating layer 50 may have a single-layer structure or a multi-layer structure. Each layer constituting the insulating layer 50 is made of, for example, an inorganic insulator such as silicon nitride and silicon oxide, or an organic insulator such as polyimide and novolac resin.

In this capacitor 1, the stacked structure including the dielectric layer 30 and the conductive layer 20b is provided not only on the first main surface S1 and in the first recesses TR1a and TR1b but also on the second main surface S2 and in the second recesses TR2a and TR2b. Thus, this capacitor 1 can achieve a larger electric capacitance.

In addition, in this capacitor 1, a plurality of first sub-regions A1a and A1b are arranged on the first main surface S1, and the length directions of the first recesses TR1a and TR1b provided in the first sub-regions A1a and A1b, respectively, are made different. Such an arrangement suppresses warping of the conductive substrate CS. In addition, in this capacitor 1, a plurality of second sub-regions A2a and A2b are arranged on the second main surface S2, and the length directions of the second recesses TR2a and TR2b provided in the second sub-regions A2a and A2b, respectively, are made different. Such an arrangement also suppresses warping of the conductive substrate CS. Then, in this capacitor 1, since the recesses are provided on both of the first main surface S1 and the second main surface S2, it is difficult for warping to occur due to difference in surface shape.

That is, this capacitor 1 can achieve a large electric capacitance, and is difficult to warp.

In addition, this capacitor 1 is easily manufactured as will be described below.

In this capacitor 1, the length direction of the first recesses TR1a provided in each of the first sub-regions A1a and that of the second recesses TR2a provided in the second sub-region A2a corresponding to the above first sub-region A1a intersect each other, and a sum of their depths is equal to or greater than the thickness of the conductive substrate CS. In addition, in this capacitor 1, the length direction of the first recesses TR1b provided in each of the first sub-regions A1b and that of the second recesses TR2b provided in the second sub-region A1b corresponding to the above first sub-region A1b intersect each other, and a sum of their depths is equal to or greater than the thickness of the conductive substrate CS. Thus, when the first recesses TR1a and TR1b and the second recesses TR2a and TR2b are formed, the through holes TH shown in FIG. 13 are generated at the positions where they intersect. Therefore, there is no need to further perform a step of forming through holes in addition to the step of forming the first recesses TR1a and TR1b and the second recesses TR2a and TR2b.

Then, in this capacitor 1, an electrical connection between the portions of the above stacked structure that are located on the first main surface S1 and the portions of the above stacked structure that are located on the second main surface S2 is performed using the through holes TH. Thus, both of the first internal electrode 70a and the second internal electrode 70b can be disposed on one side of the capacitor 1. The capacitor 1 adopting such a configuration can be manufactured in a relatively small number of process steps.

Furthermore, in this capacitor 1, both of the first internal electrode 70a and the second internal electrode 70b are disposed on one side of the capacitor 1. Thus, the first external electrode 70c and the second external electrode 70d can also be disposed on one side of the capacitor 1. The capacitor 1 adopting such a configuration can be easily mounted on a wiring board, etc.

Various modifications can also be made to this capacitor 1. For example, in this capacitor 1, any one of the structures described in the first to fourth modifications can be adopted for at least one of the first main surface S1 and the second main surface S2.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A capacitor comprising:
a conductive substrate having a first main surface and a second main surface, the first main surface including a plurality of first sub-regions, each of the first sub-regions being provided with a plurality of first recesses or first protrusions each having a shape extending in one direction and arranged in a width direction thereof, one or more of the first sub-regions and another one or more of the first sub-regions being different from each other in a length direction of the first recesses or first protrusions, and the length direction of the first recesses or first protrusions being inclined with respect to a boundary between the first sub-regions;
a conductive layer covering sidewalls and bottom surfaces of the first recesses or sidewalls and top surfaces of the first protrusions; and
a dielectric layer interposed between the conductive substrate and the conductive layer.

2. The capacitor according to claim 1, wherein the one or more of the first sub-regions and the another one or more of the first sub-regions are arranged in a checkered pattern.

3. The capacitor according to claim 1, wherein one or more of the first sub-regions are provided with a plurality of trenches as the first recesses.

4. The capacitor according to claim 1, wherein a plurality of wall parts are provided as the first protrusions in one or more of the first sub-regions.

5. A capacitor comprising:
a conductive substrate having a first main surface and a second main surface, the first main surface including a plurality of first sub-regions, each of the first sub-regions being provided with a plurality of first recesses or first protrusions each having a shape extending in one direction and arranged in a width direction thereof, and one or more of the first sub-regions and another one or more of the first sub-regions being different from each other in a length direction of the first recesses or first protrusions;
a conductive layer covering sidewalls and bottom surfaces of the first recesses or sidewalls and top surfaces of the first protrusions; and
a dielectric layer interposed between the conductive substrate and the conductive layer, wherein
one or more of the first sub-regions are provided with a plurality of trenches as the first recesses, the trenches forming a plurality of rows arranged in a width direction and each constituted by two or more trenches arranged in the length direction in each of the one or more of the first sub-regions provided with the trenches, or
one or more of the first sub-regions are provided with a plurality of wall parts as the first protrusions, the wall parts adjacent in a width direction thereof being connected to each other in each of the one or more of the first sub-regions provided with the wall parts.

6. A capacitor comprising:
a conductive substrate having a first main surface and a second main surface, the first main surface including a plurality of first sub-regions, each of the first sub-regions being provided with a plurality of first recesses or first protrusions each having a shape extending in one direction and arranged in a width direction thereof, and one or more of the first sub-regions and another one or more of the first sub-regions being different from each other in a length direction of the first recesses or first protrusions;
a conductive layer covering sidewalls and bottom surfaces of the first recesses or sidewalls and top surfaces of the first protrusions; and
a dielectric layer interposed between the conductive substrate and the conductive layer, wherein
the second main surface comprises a plurality of second sub-regions, each of the second sub-regions is provided with a plurality of second recesses or second projections each having a shape extending in one direction and arranged in a width direction thereof, one or snore of the second sub-regions and another one or more of the second sub-regions are different from each other in a length direction of the second recesses or second projections, and the conductive layer further covers sidewalls and bottom surfaces of the second recesses or sidewalls and top surfaces of the second projections, and
wherein the length direction of the first recesses or first protrusions in each of the first sub-regions is orthogonal to the length direction of the second recesses or first protrusions in the second sub-regions disposed at a position corresponding to the first sub-region.

7. The capacitor according to claim 6, wherein the one or more of the second sub-regions and the another one or more of the second sub-regions are arranged in a checkered pattern.

* * * * *